United States Patent
Pappu et al.

(10) Patent No.: US 10,901,035 B2
(45) Date of Patent: Jan. 26, 2021

(54) TECHNIQUES IN ENSURING FUNCTIONAL SAFETY (FUSA) SYSTEMS

(71) Applicant: Intel Corporation, Santa Clara, CA (US)

(72) Inventors: Lakshminarayana Pappu, Folsom, CA (US); Amit Kumar Srivastava, Folsom, CA (US); Robert Milstrey, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/265,833

(22) Filed: Feb. 1, 2019

(65) Prior Publication Data

US 2020/0249276 A1 Aug. 6, 2020

(51) Int. Cl.
| | |
|---|---|
| *G06F 17/50* | (2006.01) |
| *G01R 31/30* | (2006.01) |
| *G01R 31/28* | (2006.01) |
| *G06F 11/26* | (2006.01) |
| *G01R 31/3183* | (2006.01) |
| *G01R 31/317* | (2006.01) |
| *G06F 30/3323* | (2020.01) |
| *G06F 11/27* | (2006.01) |
| *G06F 30/20* | (2020.01) |
| *G06F 11/30* | (2006.01) |
| *G06F 30/333* | (2020.01) |

(52) U.S. Cl.
CPC ... *G01R 31/31835* (2013.01); *G01R 31/2853* (2013.01); *G01R 31/31703* (2013.01); *G01R 31/318307* (2013.01); *G06F 11/26* (2013.01); *G06F 11/27* (2013.01); *G06F 11/30* (2013.01); *G06F 30/20* (2020.01); *G06F 30/333* (2020.01); *G06F 30/3323* (2020.01)

(58) Field of Classification Search
CPC .......... G06F 11/00; G06F 11/26; G06F 11/27; G06F 11/30; G06F 30/20; G06F 30/3323; G06F 30/333
USPC ......... 716/136; 703/15; 702/59, 60, 64, 120, 702/123; 714/30, 32, 732, 733, 734, 735, 714/736
See application file for complete search history.

(56) References Cited

U.S. PATENT DOCUMENTS

| | | | | |
|---|---|---|---|---|
| 3,852,727 A | * | 12/1974 | Chacon | H04L 12/423 340/517 |
| 4,118,597 A | * | 10/1978 | Proctor | H04M 3/2272 324/117 R |
| 4,990,854 A | * | 2/1991 | Friz | B60T 8/36 324/418 |

(Continued)

FOREIGN PATENT DOCUMENTS

JP 2015001470 A * 1/2015

*Primary Examiner* — Phallaka Kik
(74) *Attorney, Agent, or Firm* — Schwabe, Williamson & Wyatt, P.C.

(57) ABSTRACT

Embodiments of the present disclosure describe methods, apparatuses, storage media, and systems for in-field safety tests on system-level and circuit-level, providing real-time and on-chip tests with respect to, including but not limited to, circuit reliability, power consumption, and system safety. The in-field safety tests may include implementing voltage droop monitors (VDMs) and signature collectors with authentication-enabled launching. Other embodiments may be described and claimed.

17 Claims, 7 Drawing Sheets

(56) References Cited

U.S. PATENT DOCUMENTS

| | | | | |
|---|---|---|---|---|
| 5,049,809 A * | 9/1991 | Wakatsuki | | H01L 43/08 324/117 R |
| 5,532,590 A * | 7/1996 | Yamanaka | | G01R 27/00 324/223 |
| 5,570,259 A * | 10/1996 | Allmeier | | G01R 15/09 361/115 |
| 6,496,028 B1 * | 12/2002 | Manhaeve | | G01R 31/3004 324/762.01 |
| 7,533,283 B2 * | 5/2009 | Fung | | G06F 1/3203 713/322 |
| 9,606,166 B2 * | 3/2017 | Kasai | | G01R 31/1272 |
| 2002/0050827 A1 * | 5/2002 | Kronrod | | G01R 1/203 324/642 |
| 2003/0001593 A1 * | 1/2003 | Kronrod | | H05K 1/0268 324/699 |
| 2004/0196056 A1 * | 10/2004 | Kronrod | | G01R 1/203 324/716 |
| 2012/0278025 A1 * | 11/2012 | Pannone | | G01R 21/01 702/104 |
| 2013/0272039 A1 * | 10/2013 | Saniter | | G01R 31/50 363/55 |
| 2015/0091550 A1 * | 4/2015 | Rotem | | G01R 31/3648 324/120 |
| 2015/0153393 A1 * | 6/2015 | Jeon | | G06F 1/3203 702/60 |
| 2016/0019386 A1 * | 1/2016 | Duplys | | G06F 21/72 713/191 |
| 2016/0054373 A1 * | 2/2016 | Kasai | | G01R 31/1272 324/551 |
| 2017/0045555 A1 * | 2/2017 | Liu | | H02M 1/4208 |
| 2017/0059645 A1 * | 3/2017 | Pan | | G11C 29/50008 |
| 2017/0146472 A1 * | 5/2017 | Clemence | | G01R 31/34 |
| 2018/0231595 A1 * | 8/2018 | Wangemann | | G01R 31/50 |
| 2018/0254626 A1 * | 9/2018 | Bemat | | G01R 19/12 |

* cited by examiner

TECHNIQUES IN ENSURING FUNCTIONAL SAFETY (FUSA) SYSTEMS

FIELD

Embodiments of the present invention relate generally to the technical fields of functionality tests on system-level and circuit-level, providing real-time and on-chip tests with respect to, including but not limited to, circuit reliability, power consumption, and system safety.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Advances in semi-conductor circuit design and processing have significantly increased the amount of logic that may be present on an integrated circuit (IC) device. Advanced IC devices have been implemented in not only traditional computing systems, but are developed to be used in other systems and fields that are close to human life. This may require higher reliability of the devices or systems to avoid device/system failures causing potential life threats. For example, Automotive Safety Integrity Level (ASIL) is a risk classification scheme defined by the International Organization for Standardization (ISO) 26262 to define functional safety for road vehicles standard. Particularly, ASIL level D, which refers to the highest classification of initial hazard, defines strict requirements of very low defect per million (DPM) for the parts, devices, and systems used in automobiles.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A or B" and "A and/or B" mean (A), (B), or (A and B). For the purposes of the present disclosure, the phrases "A, B, or C" and "A, B, and/or C" mean (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include any combination of integrated circuits (for example, a field-programmable gate array (FPGA), an application specific integrated circuit (ASIC), etc.), discrete circuits, combinational logic circuits, system on a chip (SOC), system in a package (SiP), processors, central processing unit (CPU), graphics processing unit (GPU), processors on chip (POC), memory, or input/output (IO) port that provides the described functionality. In some embodiments, the circuitry may execute one or more software or firmware modules or programs to provide the described functions. In some embodiments, circuitry may include logic, at least partially operable in hardware. "Circuitry," "components," and "devices" may be used interchangeably herein.

Advances in semi-conductor circuit design and processing have significantly increased the amount of logic that may be present on an integrated circuit (IC) device. Advanced IC devices have been implemented in not only traditional computing systems, but are also to be used in other systems and fields that are closely affecting human lives. For example, advanced automations are increasingly shown in modern automobiles and other vehicles. Future self-driving automobiles are a great example to show the importance of the reliability of a vehicular system, sub-systems thereof, and devices therein. This requires higher reliability of the devices and systems to avoid device/system failures causing potential life threats. For example, Automotive Safety Integrity Level (ASIL) is a risk classification scheme defined by the International Organization for Standardization (ISO) 26262 to define functional safety for road vehicles standard. Particularly, ASIL level D, which refers to the highest classification of initial hazard, defines strict requirements of very low defect per million (DPM) for the parts, devices, and systems used in automobiles. For example, a CPU may be one of the key devices to operations of a modern automobile. Thus, it becomes critical to ensure that the CPU in an automobile operates properly in the field, for example, when starting the automobile every time and during driving, rather than only at the time of shipment of the automobile. In some other fields of applications, strict reliability may be demanded as well, such as for medical devices in diagnosis, surgical and non-surgical assistances, intensive-care assistance, etc.

As used herein, the term "IC" may refer to, be part of, or include any combination of CPU, GPU, SOC, SIP, or other processors performing computing, control or other functions in a system. A CPU may include one or more cores to perform those functions individually or together. Further details are to be discussed in later paragraphs.

Figure 1:
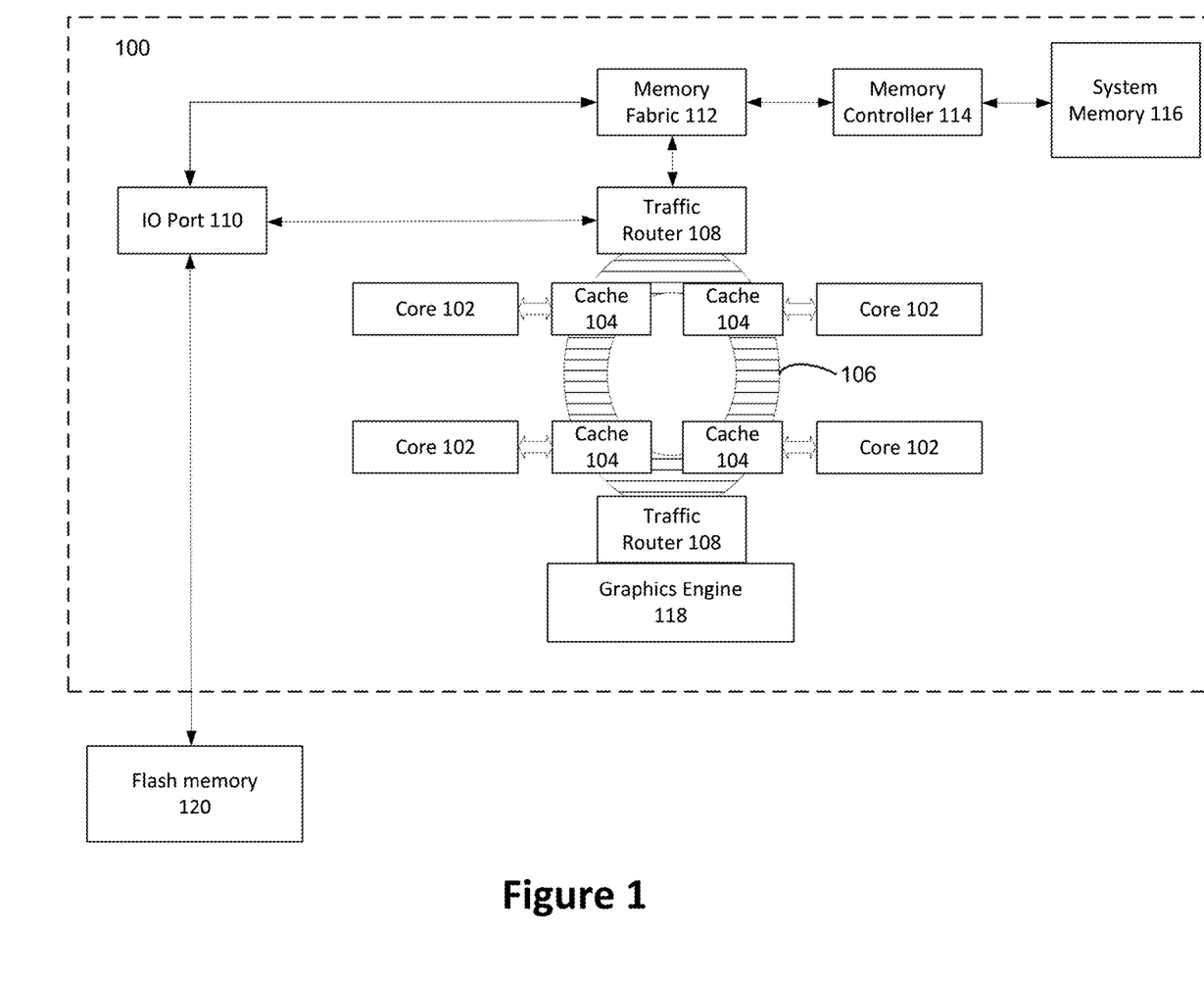
FIG. 1 schematically illustrates an example computing IC chip in accordance with various embodiments.

FIG. 1 schematically illustrates an example computing IC chip (hereinafter "IC 100") in accordance with various embodiments herein. The IC 100 may be an SOC or the like. The IC 100 may include multiple cores 102 coupled to respective caches 104. The caches 104 may be coupled or connected via a communication bus 106 for core trafficking, and some other types of trafficking that may involve other components on an SOC, for example, a memory, IO fabrics, and/or graphics engines. The communication bus 106 may facilitate a bus-based communication on SOC, a network-on-chip (NOC) communication, or other types of communications on SOC. In some embodiments, the communication bus 106 may have a ring structure, as shown in FIG. 1. Additionally, or alternatively, the communication bus 106 may be a high-bandwidth (BW) communication bus in some embodiments.

The data flow or trafficking may be managed by one or more traffic routers 108. The traffic router 108 may control data packet routing from/to the cores 102 to/from IO ports 110, or memory fabrics 112, which may be further coupled to a memory controller 114 and system memory 116. The traffic router 108 may route traffic from/to cores to/from graphics engines 118. The traffic router 108 may be a guaranteed throughput (GT) router, a best effort (BE) router, or a router with other features to accommodate certain data trafficking. The IC 100 may be coupled to one or more peripheral components either on the SOC or off the SOC. For example, an off-chip flash memory 120 may be coupled to the IO port 110. The IC 100, as a central computing device or SOC, may be implemented in an automobile, a medical device, or any other devices that require high reliability. In such applications, the IC 100 is required to be functional not only on the shelf, but under in-field operations. Once the IC 100 has one or more parts experiencing certain malfunction, the overall system may need to be warned immediately, provided with sufficient remedies, or ordered to be out-of-service depending on the severity of the malfunction.

Embodiments described herein may include, for example, apparatuses, systems, methods, and storage media for implementing and configuring, or related to, in-field on-chip functional tests on key components of ICs to ensure safe operations of the ICs and systems. Those key elements include, but are not limited to, computing cores, graphics engines, other SOC engines, IO ports, IO fabrics, memory fabrics, memory controllers, and any other elements on SOCs.

Figure 2A:
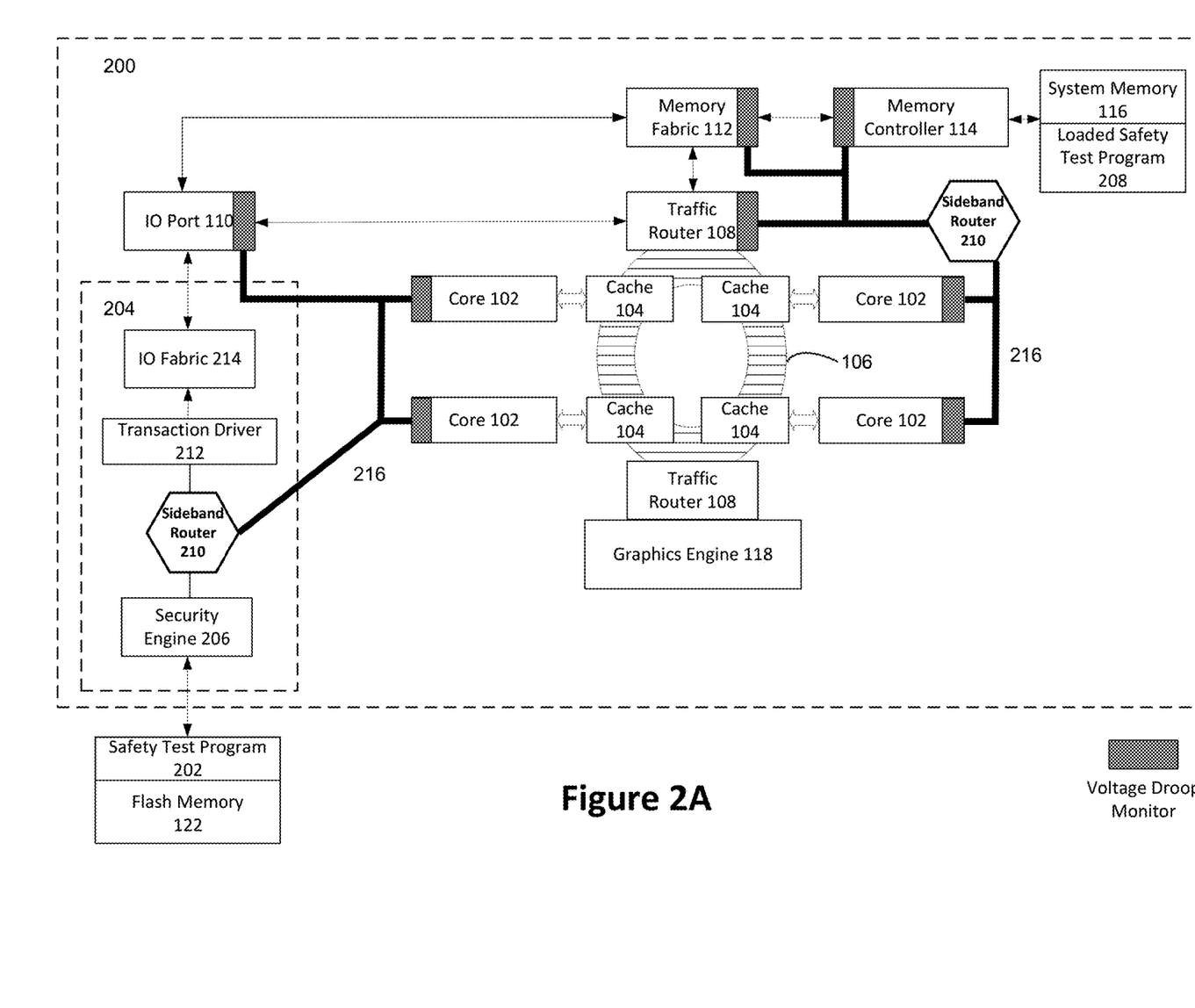
FIG. 2A illustrates an example in-field safety test IC to enable on-chip functional tests with droop detection in accordance with some embodiments.

FIG. 2A illustrates an example in-field safety test IC 200 to enable on-chip functional tests with droop detection in accordance with some embodiments. In contrast to the IC 100 of FIG. 1, FIG. 2A depicts example components and system to detect abnormalities of key parameters of the IC 100 and diagnose functionalities of key components of the IC 100. It is noted that FIG. 2A shows example components of an SOC that may be related to in-field self-testing and other components of the SOC may not be shown for simplicity.

In some embodiments, from a test flow viewpoint, an in-field safety test program 202 may be stored in the flash memory 122 originally (e.g., prior to shipment of the device that encompasses the IC 200 to a user). The "in-field" test refers to a test that is conducted during operations of the product by an end user compared to conventional tests, which usually are conducted not in the field, but during a manufacturing process or at a manufacturer before the product is in use.

The safety test program 202 may be triggered and loaded by a Basic Input/Output System (BIOS) of the system via an on-package-interface or one or more IO interfaces. The initiation of the safety test program 202 may involve a fabric launcher 204 to load the safety test program 202 into an isolated memory region (IMR) in the system memory 116, via a primary channel. The BIOS may signal a security engine 206 in the fabric launcher 204 to load one or more in-field tests from the safety test program 202. The security engine 206 is an on-die device in the fabric launcher 204 and may be used to authenticate the incoming safety test program 202. The authenticated in-field tests may eventually be loaded into the system memory 116, as loaded safety test program 208. If the security engine 206 determines a launching in-field test has not been authenticated, such an in-field test may be aborted. This mechanism may protect system integrity from hackers' tampering.

The security engine 206 may be coupled to other IC components via one or more sideband routers 210. Multiple sideband routers 210 may be used on the SOC as interfaces to couple various components or devices. A transaction driver 212 may launch incoming transactions to a primary IO fabric 214. The transactions may be further transferred to other fabrics and reach the system memory 116. In some embodiments, a data storage may be used as part of the launching process to store data. In other embodiments, data of various transactions may be converted by specific protocol converter(s) in the loading process.

There are various in-field tests to detect abnormalities of key components on the SOC. In some embodiments, the in-field tests detect the abnormalities by detecting voltage droop, current droop, and/or power droop. The voltage/current/power may be measured against a frequency, at which the respective components operate, to determine any droop or abnormality. More details are discussed elsewhere herein.

In contrast to FIG. 1, FIG. 2A illustrates components to enable voltage/current/power drooping detection. For the purpose of simplicity, voltage will be used in the following descriptions. It is noted that current and power drooping detection can apply by using the same or similar methods, apparatuses, devices or components. A voltage droop may show the delta of a voltage drop from its normal or typical level (e.g., as indicated by a prior voltage measurement or a predetermined baseline voltage level). The voltage droop may indicate an abnormal behavior or performance of the component under test. A voltage droop monitor (VDM) may be implemented onto, embedded in, or coupled to the key components to be monitored. FIG. 2A shows multiple VDMs in grey-colored blocks, as noted in FIG. 2A. A VDM coupled to the core 102 may measure operating voltage during the operation of the core 102 and/or during the in-field safety test. An operating voltage may be a core voltage that is supplied by a power supply with a power management unit (not shown). The voltage may be measured at, but not limited to, a voltage input to the core 102 and/or any access point to the core 102 to provide relevant voltage information that may indicate functionality of the core 102. Since a computing core may operate at various frequencies to achieve different performances and the corresponding operating voltages may be different accordingly, it may be more accurate to measure the voltage associated with the operating frequency and determine whether there is a voltage droop at that particular operating frequency. When there are several operating frequencies involved, a curve may be drawn to show an overall performance of voltage versus frequency to estimate the overall or partial performance of the core 102. In some embodiments, the VDM may be implemented onto components on an SOC other than the cores. Those components may include, but are not limited to, traffic routers, IO ports, memory fabrics, memory controllers, and any other components on an SOC or the like.

In some embodiments, the VDMs may measure the voltage itself and record the measured values. The measurements may include measurement or recordation of the operating frequencies so that the voltage values are associated with particular operating frequencies. The VDMs may store all the measurements locally and report them to a master core or other controlling components up on a request/inquiry by the master core or the controlling component. The VDMs may measure current, power and/or other parameters that are related to the operations of the components on the SOC. The VDMs may store all or part of those measurements locally or at some central storage, for example, the system memory 116, or a data storage inside the fabric launcher 204. The master core may be one of the cores 102.

In some embodiments, the VDMs may detect voltage droop. The VDMs may measure a droop directly with certain type of analog circuitry design. In other embodiments, the VDMs may measure the absolute voltages and compare the measured values with one or a set of expected values to determine whether there is a droop and how large the droop is. The expected values may be predetermined and stored locally in each VDM. Alternatively or additionally, the expected voltage values may be stored in a separate memory on SOC.

In some embodiments, a functionality of the core under test may be determined based on the corresponding VDM measurements. For example, if the measured voltage(s) is below certain threshold value(s), the core may be deemed nonfunctional. The determination process may be based on the measured voltages or voltage droops at different operating frequencies. The determination process may also be based on measured current and/or power values, or a combination thereof. It is noted that various algorithms may be used to determine the functionalities in practice according to an IC's design and implementation. Such determinations may be conducted by individual VDMs locally, or centralized control circuitry, or the master core as below discussed.

In some embodiments, the VDMs may be coupled among themselves via one or more sideband routers 210, as shown by connections 216. Since each VDM is coupled with the core at which it measures, each core now may have access to all of the VDMs, including the ones coupled to other IC components. A master core may be assigned to collect all the measurements from the VDMs and analyze performance of those IC components based on the measurements. The master core may be one of the cores 102. The master core may then report its analysis results to the security engine 206. In accordance, the security engine 206 may determine corresponding actions against the cores 102 and other components. For example, if a core is deemed functional, no action may be granted against that core; but if a core is deemed nonfunctional, that core may be disabled or turned off as a non-critical error, but the rest of the IC may still be functional and operate normally. In some cases, if more cores and/or other critical components are deemed nonfunctional, the security engine 206 may determine this is a critical error of the IC and the IC or the system may be shut down completely, because operating with too many nonfunctional components may be too dangerous to the system or the user. For example, if more than half of the cores are deemed non-functional, the system may be deemed to have a critical error. However, various criteria may be used in such a determining process.

In some embodiments, the security engine 206 may load the status of the cores, e.g., either functional or nonfunctional, to the system memory 116 or flash memory 122. The BIOS may report the status of the cores to a system controller that monitors the entire system, such as a vehicle or a medical device. The system controller may determine operations of the system based on the status of the components on the SOC and/or status of other parts of the system. Such operations may include, but are not limited to, no reaction, generating a warning message, turning off parts of the system, and shutting down the entire system. When the in-field test is conducted as part of the initiation or "turn on" of the system, the system may be prevented from completing the turn on process under a critical error condition.

In some embodiments, separate control logic circuitry may be implemented on the IC 200 to determine the functionalities of the cores. Such a control logic circuitry may help ensure functionality of the master core. For example, in cases of a non-functional master core or no cores are functional, the control logic may act as a master core to analyze and determine functionalities of the IC components based on the VDM measures. In some embodiments, the control logic may be used alternatively of a master core. The logic controller may report the status of the cores to the security engine 206 for further analysis. The logic controller may be implemented on the SOC independently, or embedded in a component, such as an IO port or a memory. In some embodiments, the IO port 110 may analyze the VDM measurements and determine the functionalities of the cores 102. If the determinations by both the master core and the IO port have the same results, the security engine 206 may confirm the results and determine the status of the IC accordingly. However, if the determinations by the master core and determination by the IO port have different results of the functionalities of the cores 102, the security engine 206 may elect the results from the IO port to determine the status of the IC. In some embodiments, the IO port 110 may operate at a lower frequency compared to the master core. For example, the operating frequency of the IO port 110 may be a fraction of the operating frequency of the master core. Thus, in some embodiments, it may be more accurate to rely on the analysis of the IO port 110. IO port 110 may as well provide more reliable analysis than the cores.

Figure 2B:
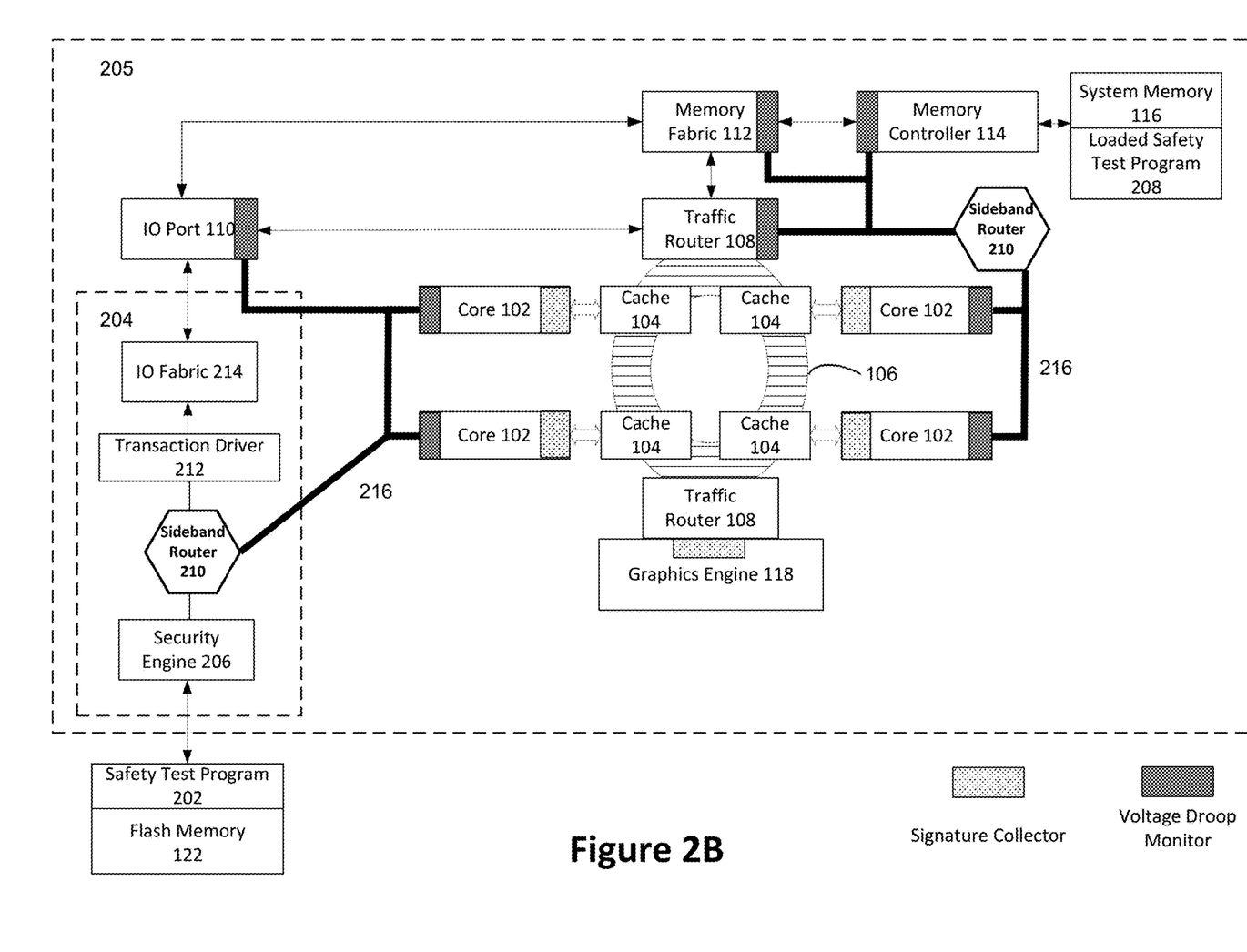
FIG. 2B illustrates an example in-field safety test IC to enable on-chip functional tests with signature tests in accordance with some embodiments.

FIG. 2B illustrates an example in-field safety test IC 205 to enable on-chip functional tests with signature tests in accordance with some embodiments. In addition to FIG. 2A, FIG. 2B illustrates signature collectors shown in dotted blocks. A signature collector may be deployed in an interface of the core 102 facing the cache 104 or other high traffic interfaces on the communication bus 106. The interface may be a core-to-uncore (C2U) interface or an uncore-to-core (U2C) interface. The signature collectors may be embedded in or coupled to the core 102, graphics engine 118, or other key components on the SOC. Once an in-field functional test is initiated, signature test data may be generated by the security engine 206 and a signature collector may tunnel the test data in and run corresponding signature tests. In contrast to voltage drooping detection, the signature test focuses on digital data analysis. The test data may be generated by the loaded safety test program 208 and/or the security engine 206. Those test data may have one or more unique "digital signatures" that may be used for examining functionalities of the cores and the reliabilities of corresponding data flow paths. In some embodiments, the test data may be processed by a specific algorithm to generate a signature value. For example, a polynomial function, such as $f(x)=x16+x7+x5+x3+x2+1$, may be used to compress the test signature data into a 32-bit signature value. The signature value may be reported to the master core and the master core may determine the correctness of the core operation and corresponding program executions. If the signature value is deemed incorrect, the master core may also isolate the core from normal operation, or turn off the core accordingly. A predetermined or pre-calculated value based on the test data may be used as a reference in determining a correctness of the signature value. In some embodiments, a range of the values may be used in determining the correctness of the signature value, if certain error rate is acceptable.

In some embodiments, the signature value may be reported to the security engine 206 and the security engine 206 may determine the correctness of the core operation and corresponding program executions. If the signature value is deemed incorrect, the corresponding core may be deemed defective. The defective core may be isolated or disabled by the security engine 206.

In some embodiments, both the signature test results and the VDM measurement results may be used together to determine the actions to the cores and/or the system. The combined analysis maybe conducted by the master core or the security engine 206.

In some embodiments, the signature collectors may be implemented independently without VDMs. Additionally, or alternatively, in some embodiments, the signature tests may be initiated and loaded by the fabric launcher 204.

Figure 3:
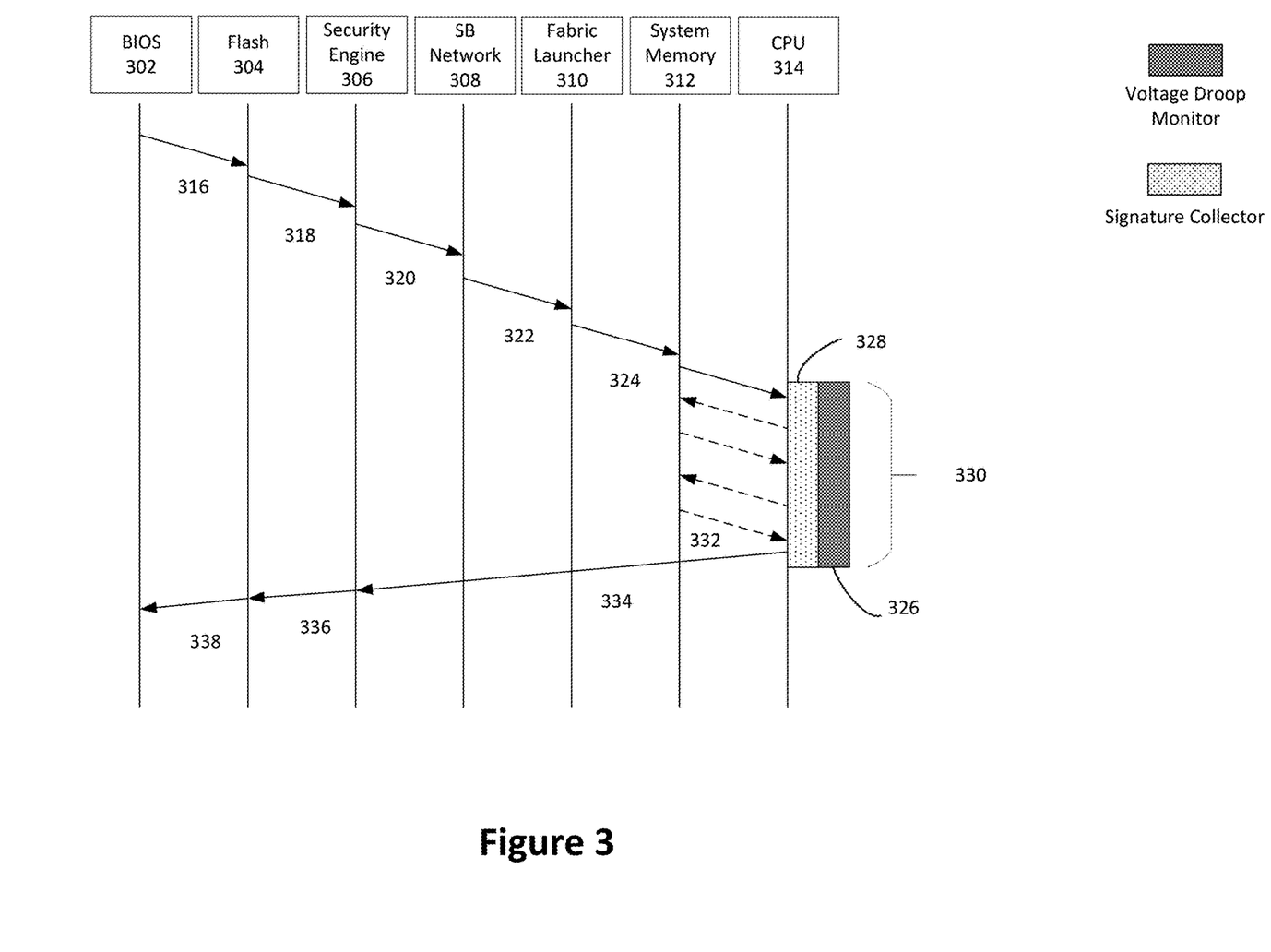
FIG. 3 illustrates an example in-field safety test workflow with representative components.

FIG. 3 illustrates an example in-field safety test workflow with representative components. Other components may additionally or alternatively be used in this process, but are not illustrated for ease of understanding. In this example, a BIOS 302, flash 304 that is the same or substantially similar to the flash 122, security engine 306 that is the same or substantially similar to the security engine 206, sideband network 308 that is the same or substantially similar to the sideband router 210, fabric launcher 310, system memory 312 that is the same or substantially similar to the system memory 116, and CPU 314 are used in the safety test program launching process. The CPU 314 may include one or more cores 102, and one of the cores 102 may be a master core. The BIOS may initiate or periodically interrupt the flash 304 to the in-field safety test program 202 (hereinafter "program 202"), as indicated by 316. The flash 304 may then initiate loading the program 202 to the security engine 306, as indicated by 318. The security engine 306 may authenticate the program 202, as indicated by 320. The sideband network may transfer the safety test program to the fabric launcher 310 as indicated by 322. The fabric launcher 310 may convert the program into adequate format for further operation, as indicated by 324.

A loaded safety test program may be executed by the system memory 312, the CPU 314, the VDMs 326, the signature collectors 328, and/or other logic controller 330 and circuitry. The VDMs 326 and signature collectors 328 may be used respectively or together. Measurements and corresponding data may be exchanged back and forth among the above-mentioned components as indicated by 332. Eventually, the test results and analysis results may be reported to the security engine 306, or the sideband network 308 for further processing, as indicated by 334. The security engine 306 may report the status of the cores and other components to the flash 304 or the BIOS 302 as indicated by 336 and 338, respectively. The BIOS 302 may then intercept an action towards the cores or even the entire system based on an order from a system monitor. In some embodiments, the security engine may determine actions towards the cores and other components on the SOC based on the test results in program 202.

In some embodiments, the program 202 may include, but may not be limited to, one or more of functional tests of voltage, current, or power against operating frequencies; power versus frequency operation for system optimization; power virus tests for detecting voltage droops; and other SOC functional or performance tests.

Figure 4:
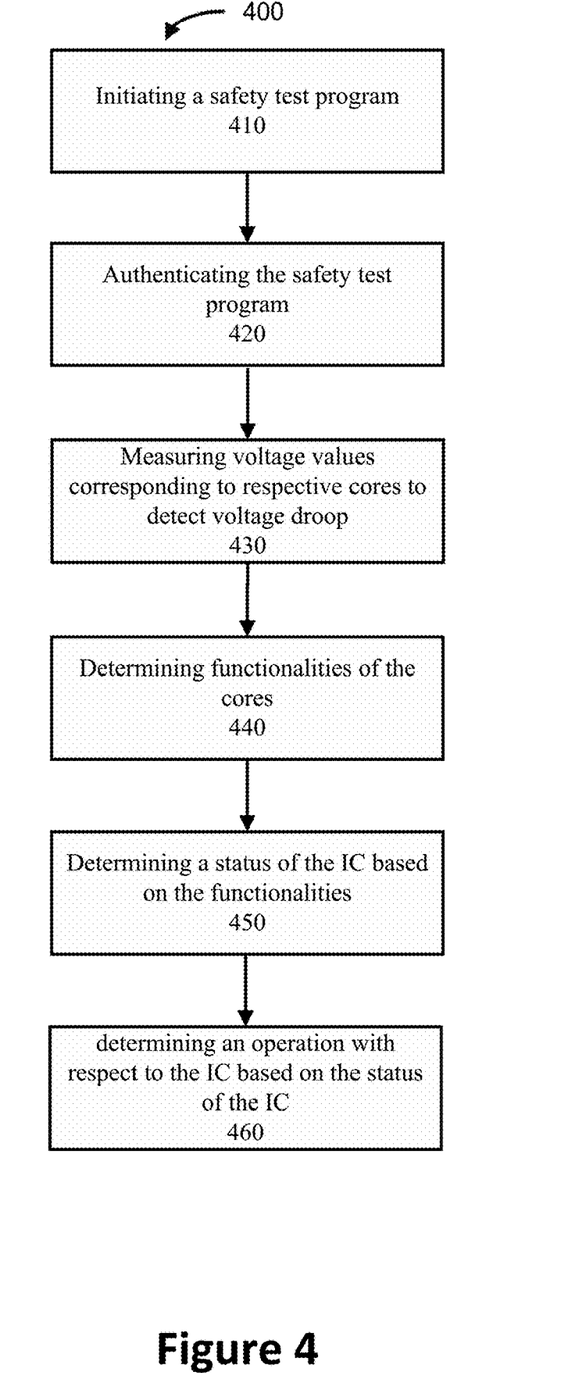
FIG. 4 illustrates an operation flow/algorithmic structure to facilitate a process of in-field safety test program by the IC in accordance with some embodiments.

FIG. 4 illustrates an operation flow/algorithmic structure 400 to facilitate a process of in-field safety test program by the IC 200 in accordance with some embodiments. The operation flow/algorithmic structure 400 may be performed by the ICs 200 or circuitry thereof.

The operation flow/algorithmic structure 400 may include, at 410, initiating a safety test program. The safety test program 202 may be periodically triggered by a system monitor, BIOS, or some other part of the system. The safety test program may be mandated at the initiation or turn-on stage of the system.

The operation flow/algorithmic structure 400 may further include, at 420, authenticating the safety test program. The safety test program 202 may be authenticated by a security engine 206. The security engine 206 may be a component on an SOC or a part of a fabric launcher on the SOC. The authentication may abort the program 202 if the program 202 has been tampered.

The operation flow/algorithmic structure 400 may further include, at 430, measuring voltage values corresponding to respective cores to detect voltage droop with respect to the cores. In some embodiments, voltage values may be measured by the VDMs respectively, and/or voltage droops may be detected directly or indirectly by the VDMs. The measurements or detections may be conducted over current and/or power. In some embodiments, the measurements or detections may be conducted against one or more operating frequencies. In other embodiments, other components may be measured by the VDMs as well, for example, IO ports, memory controller, etc.

The operation flow/algorithmic structure 400 may further include, at 440, determining functionality of each of the cores. The functionality of a core may be functional or nonfunctional. There may be various algorithms or formulae to determine whether a core is functional or nonfunctional under the test. For example, a core may be deemed nonfunctional if a measure voltage value is lower than a prescribed threshold value. Meanwhile, if the measured value is equal to or larger than the threshold value, the core may be deemed functional. In addition, if the measured value is larger than another prescribed threshold value, the core may be deemed nonfunctional. In other words, if the measured value is within a range, the core may be deemed functional. When a voltage droop is detected, the drooping value may be compared to a prescribed drooping threshold value. The determination may be conducted by a master core, or a logic controller on the IC. The logic controller may be embedded in a component of the SOC, such as an IO port.

The operation flow/algorithmic structure 400 may further include, at 450, determining a status of the IC, based on the functionalities of the cores. The status of the IC may be no-errors, noncritical-errors, or critical-errors. For example, no-errors refers to a condition that no cores are nonfunctional; noncritical-errors refers to a condition that the total number of the nonfunctional cores is lower than a threshold number or percentage; and critical-errors refers to a condition that the total number of the nonfunctional cores is equal to or larger than the threshold number or percentage. In addition, the determination may be based on the signature test results if such results are available.

The operation flow/algorithmic structure 400 may further include, at 460, determining an operation with respect to the IC, based on the status of the IC. The operation may be a do-nothing action, if the IC status is no error. The operation may be to turn off one or more cores that are deemed nonfunctional, if the IC status is non-critical error. The operation may be to shut down the IC, if the IC status is critical error. A master core, separate logic controller, security engine, or other system control/monitor part may determine the operation of the IC. In addition, the determination may be based on the signature test results together with the voltage droops, if such results are available.

Figure 5:
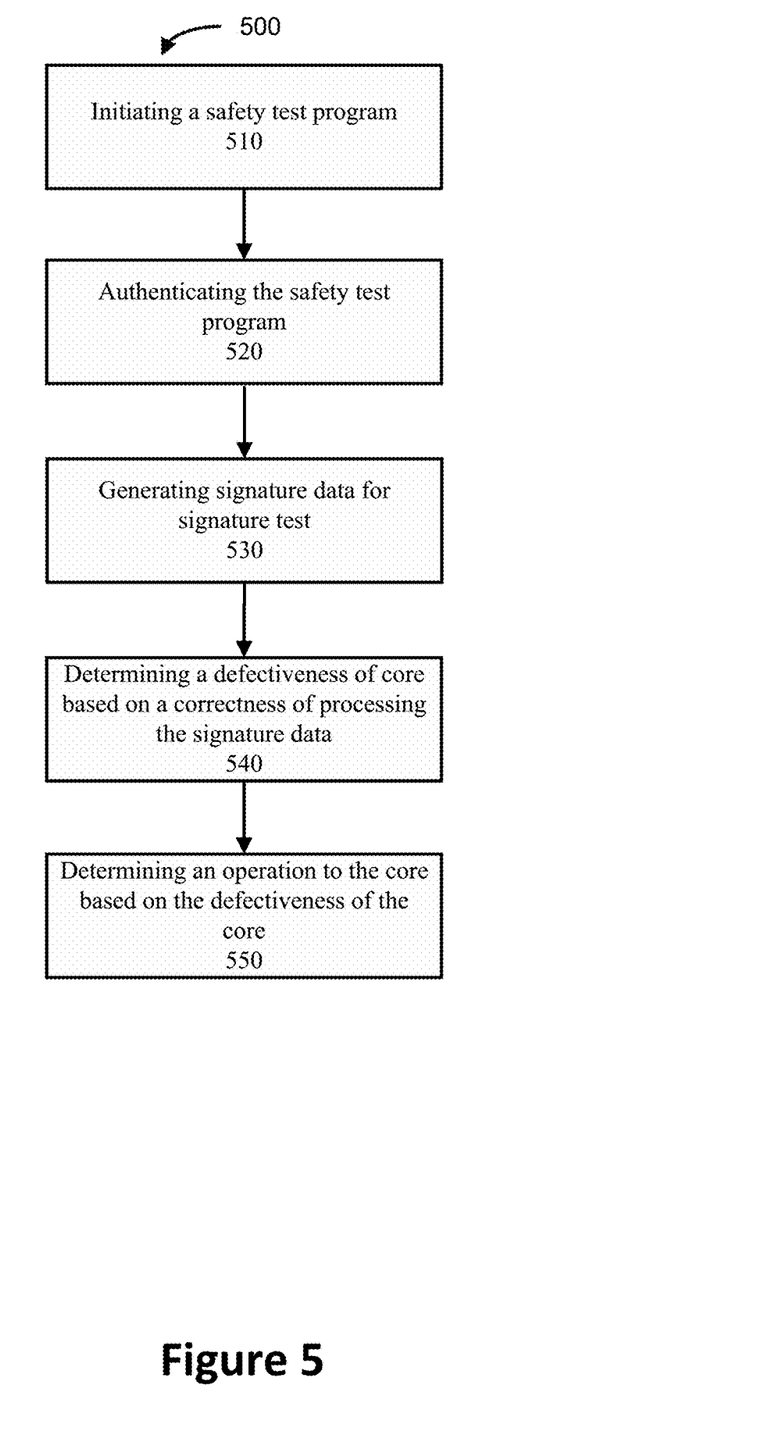
FIG. 5 illustrates an operation flow/algorithmic structure to facilitate the process of in-field safety test program regarding signature tests by the signature collectors in accordance with some embodiments.

FIG. 5 illustrates an operation flow/algorithmic structure 500 to facilitate the process of in-field safety test program regarding signature tests by the signature collectors in accordance with some embodiments. The operation flow/algorithmic structure 500 may be performed by the ICs 205 or circuitry thereof.

The operation flow/algorithmic structure 500 may include, at 510, initiating a safety test program. The safety test program 202 may be periodically triggered by a system monitor, BIOS, or some other part of the system. The safety test program may be mandated at the initiation or turn-on stage of the system.

The operation flow/algorithmic structure 500 may further include, at 520, authenticating the safety test program. The safety test program 202 may be authenticated by the security engine 206. The security engine 206 may be a component on an SOC or a part of a fabric launcher on the SOC. The authentication may prevent the program 202 from further operation by illegal initiation or if the program 202 has been tampered.

The operation flow/algorithmic structure 500 may further include, at 530, generating signature data for the signature test. The signature data may be generated by the security engine 206 and transferred through trafficking path to each core to be tested. The signature data may be received and processed by each of the signature collectors in the cores. A signature collector may be implemented in a graphics engine 118, or other components on the SOC.

The operation flow/algorithmic structure 500 may further include, at 540, determining a defectiveness of a core based on a correctness of processing the signature data. In some embodiments, the signature data may be processed into a value via certain functions or equations. For example, a polynomial function of $f(x)=x16+x7+x5+x3+x2+1$ may compress the signature data into a 32-bit value. Such a value may be analyzed or compared to determine the correctness of the core performance with the test program execution. The comparison may use a known correct signature value as a baseline reference. Each core may process the signature data respectively to complete the signature test. The analysis and determination of each core may be conducted by the master core centrally, or the signature collectors locally. A separate logic controller may be used to conduct the analysis and determination if the master core is nonfunctional. In some embodiments, a range of the correct signature value may be used to determine the defectiveness of the core.

The operation flow/algorithmic structure 500 may further include, at 550, determining operations with respect to the cores respectively. In some embodiments, if the core is determined defective, an operation to isolate the core or turn off the core may be ordered. Information regarding the defectiveness of the core may be reported to the security engine 206 and the security engine may determine any operation towards the core. In some embodiment, the security engine 206 may further report the defectiveness of the core to the system-level monitor or controller to determine operations to the core, the IC, or the system.

In some embodiments, the in-field safety test program 202 may execute both the voltage droop detection and signature test, as illustrated in FIGS. 4 and 5. Then the security engine 206 or the system controller may determine operations to individual cores, the IC, and/or the entire system based on both results from the VDMs and signature collectors.

Figure 6:
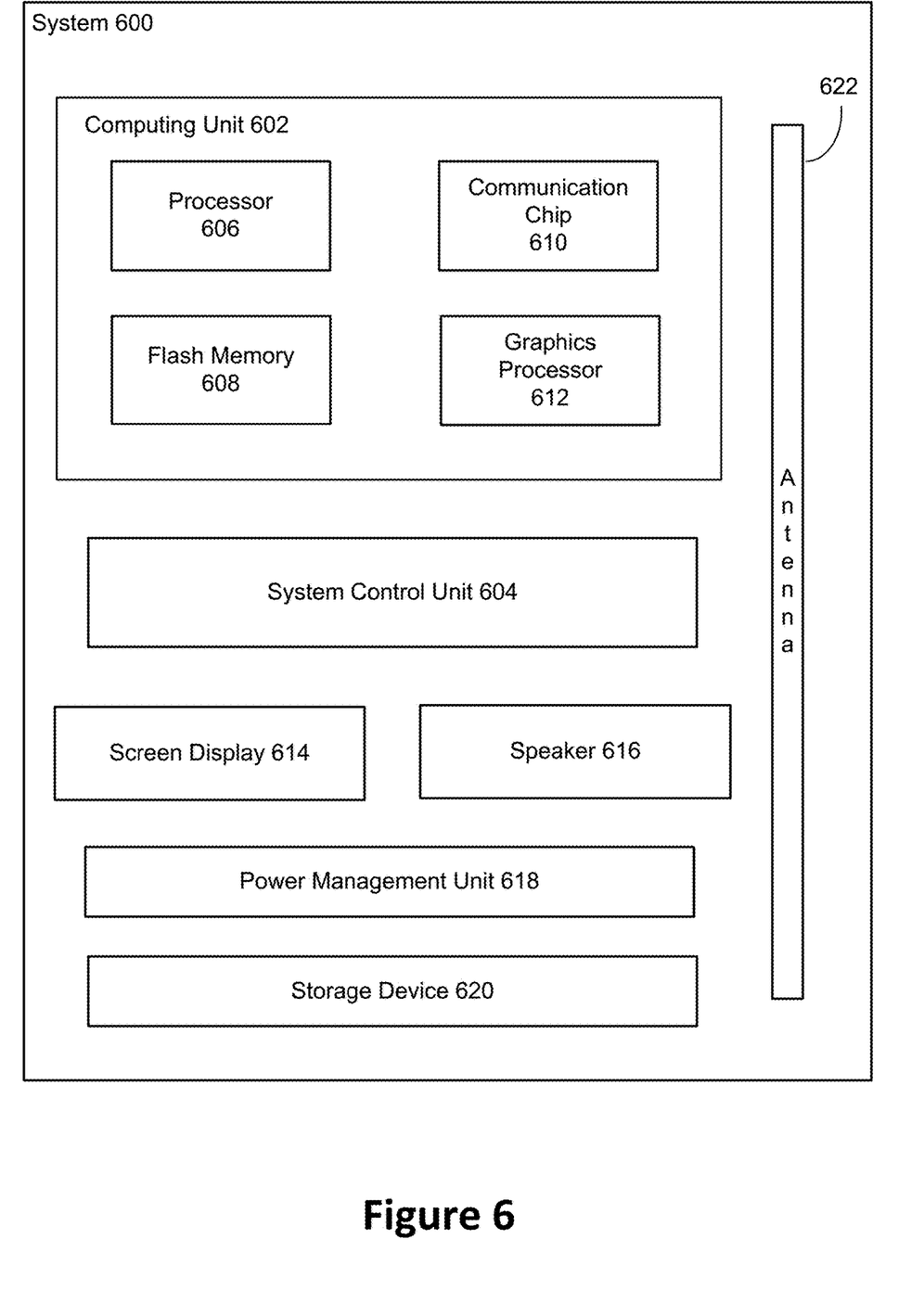
FIG. 6 illustrates an example system that may employ the apparatuses and/or methods described herein, in accordance with various embodiments.

FIG. 6 illustrates an example system 600 that may employ the apparatuses and/or methods described herein (e.g., IC 100, IC 200 and/or IC 205), in accordance with various embodiments. In some embodiments, the system 600 may be part of or implemented by an automotive system. As shown, the system 600 may include a computing unit 602, a system control unit 604, and some other devices that affiliate with the system 600. The computing unit 602 may include one or more processor(s) 606 (one shown). In various embodiments, the one or more processor(s) 606 each may be the same as or substantially similar to the IC 100, IC 200 and/or IC 205. Each processor may include one or more processor cores, which may be the same as or substantially similar to the cores 102. The computing unit 602 may include a flash memory 608. The flash memory 608 may be the same as or substantially similar to the flash memory 120 or 122. The safety test program 202 may be stored in the flash memory 608. In various embodiments, at least one communication chip 610 may be physically and electrically coupled to the one or more processor(s) 606. In further implementations, the communication chip 610 may be part of the one or more processor(s) 606. A graphics processor 612 may be physically and electrically coupled to the one or more processor (s) 606. In further implementations, the graphics processor 612 may be part of the one or more processor(s) 606.

In various embodiments, the system control unit 604 may monitor and control individual components in the system 600. These components include, but are not limited to, the computing unit 602, a screen display 614 (e.g., a non-touchscreen display or touchscreen display), a speaker 616, a power management unit 618, a storage device 620 (e.g., a hard-disk drive (HDD)), one or more antenna(s) 622, a digital signal processor (not shown), a crypto processor (not shown), a display (not shown), a battery (not shown), an audio codec (not shown), a video codec (not shown), a global positioning system (GPS) device (not shown), a compass (not shown), an accelerometer (not shown), a gyroscope (not shown), a camera (not shown), and a mass storage device (such as a hard disk drive, solid state drive, compact disk (CD), digital versatile disk (DVD)) (not shown), engine of an automotive system (not shown) and so forth. In various embodiments, the processor 606 may be integrated on the same die with other components to form an SOC.

In various embodiments, the system control unit 604 may determine functionalities of the one or more processor(s) 606, based on the execution of the safety test program 202. In accordance, the system control unit 604 may further determine corresponding operations or actions to the system 600 and/or various units and components described therein, based on the results from the safety test program 202. The system control unit 604 may or may not authorize initiating the engine in an automotive system, send a message to the user (e.g., driver) regarding the status of the system 600, disable certain parts (e.g., non-functional core(s)), or perform other various operations upon the implementations.

In various embodiments, the system 600 may include a printed circuit board (PCB). For these embodiments, the system control unit 604, flash memory 608, communication chip 610, graphics processor 612, and power management unit 618 may be disposed thereon. In alternate embodiments, the various components may be coupled without the employment of the PCB.

In various embodiments, the system 600 may be implemented as part of or by medical diagnostic, operational or other related instruments.

Some non-limiting Examples of various embodiments are provided below.

Example 1 is an apparatus of an integrated circuit (IC) comprising: voltage droop monitors (VDMs) to measure voltage values of respective cores in a computing unit of the IC; an interconnection to couple VDMs to one another; and a master core that is one of the cores, the master core to acquire measured voltage values; determine individual functionalities of the respective cores to be functional or nonfunctional, based on comparison between the respective measured voltage values and at least one expected voltage value; and determine, based on the determined functionalities, a status of the IC.

Example 2 is the apparatus of example 1 and/or some other examples herein, wherein the VDMs are respectively embedded in or coupled to each of the cores.

Example 3 is the apparatus of example 1 and/or some other examples herein, wherein the interconnection is to couple VDMs to one another in a ring network.

Example 4 is the apparatus of example 1 and/or some other examples herein, wherein each measured voltage value of the measured voltage values is associated with an operating frequency at which the corresponding core operates during the measurement, and the at least one expected voltage value is associated with the same operating frequency.

Example 5 is the apparatus of example 1 and/or some other examples herein, wherein the status of the IC is no error, non-critical error, or critical error.

Example 6 is the apparatus of example 5 and/or some other examples herein, wherein the master core is further to determine, based on the status of the IC, an operation to the IC, wherein the operation to the IC is to do-nothing according to the status of no error, disable nonfunctional cores of the IC according to the status of non-critical error, or shut down the IC according to the status of critical error.

Example 7 is the apparatus of example 1 and/or some other examples herein, further comprising a security engine, wherein the master core is further to report the error status of the IC to a security engine.

Example 8 is the apparatus of example 7 and/or some other examples herein, wherein the security engine is further to determine, based on the reported status of the IC, an operation to the IC, wherein the operation to the IC is to do-nothing according to the status of no errors, disable nonfunctional cores of the IC according to the status of non-critical errors, or shut down the IC according to the status of critical errors.

Example 9 is the apparatus of example 7 and/or some other examples herein, wherein the security engine is further to report the error status of the IC to a system controller to determine an operation to the IC.

Example 10 is the apparatus of example 1 and/or some other examples herein, wherein the VDMs are to measure current values respectively corresponding to the measured voltage values of cores to derive respective power values of the cores, or to measure power values of the cores.

Example 11 is the apparatus of example 1 and/or some other examples herein, wherein the VDMs are further to detect voltage droops, based on comparison between the measured voltage values and at least one expected voltage value that are predetermined.

Example 12 is the apparatus of example 1 and/or some other examples herein, further comprising VDMs embedded in other components on the IC to detect voltage values of the respective other components, wherein the other components include an input/output (TO) port, a memory fabric, and a memory controller.

Example 13 is the apparatus of example 12 and/or some other examples herein, further comprising the IO port to: acquire the measured voltage values from the VDMs; determine functionalities of the cores and the other components to be functional or nonfunctional, based on comparison between the detected one or more voltage values and at least one expected voltage value that are predetermined; determine, based on the determined functionalities, a status of the IC; and determine, based on the determined status of the IC, an operation to the IC.

Example 14 is the apparatus of example 12 and/or some other examples herein, further comprising a logic controller to: compare the functionality determination by the master core and the functionality determination by the IO port; and determine the status of the IC based on the functionality determination by the IO port.

Example 15 is a system for executing a safety test, comprising: a fabric launcher to initiate a safety test program; a security engine to authenticate the safety test program; and generate signature test data; multiple signature collectors, each signature collectors to acquire the signature test data transmitted to or from a core of an integrated circuit (IC); compress the acquired data with a predetermined polynomial function to generate a compressed value corresponding to the acquired data; determine a correctness of safety test program execution regarding the core, based on comparison between the compressed value and one or more predetermined values; and determine, based on the determined correctness, whether the core is defective so as to be isolated.

Example 16 is the system of example 15 and/or some other examples herein, wherein the security engine is further to abort the safety test program based on a failed authentication of the safety test program.

Example 17 is the system of example 15 and/or some other examples herein, further comprising: voltage droop monitors (VDMs) to detect voltage values respectively corresponding to the cores at specific operating frequencies; a master core that is one of the cores, to acquire the detected voltage values; determine functionalities of the cores respectively to be functional or nonfunctional, based on comparison between the detected voltage values and expected voltage values that are predetermined; report the determined functionalities to the security engine.

Example 18 is the system of example 17 and/or some other examples herein, wherein the security engine is further to determine a status of the IC based on the determined functionalities and correctness.

Example 19 is the system of example 17 and/or some other examples herein, wherein the security engine is further to determine, based on the determined status of the IC, an operation to the IC, wherein the operation to the IC is to do-nothing according to the status of no errors, disable nonfunctional cores of the IC according to the status of non-critical errors, or shut down the IC according to the status of critical errors.

Example 20 is one or more non-transitory computer-readable media (NTCRM) comprising instructions to, upon execution of the instructions by circuitry of an integrated circuit (IC), cause the IC to: initiate a safety test program; authenticate, by a security engine of a fabric launcher, the safety test program; measure, by voltage droop monitors (VDMs), voltage droops of cores of the IC; determine respective functionalities of the cores to be functional or nonfunctional based on comparisons between the measured voltage droops and at least one threshold value; determine, based on the determined functionalities, a status of the IC; and determine, based on the determined status of the IC, an operation of the IC.

Example 21 is the NTCRM of example 20 and/or some other examples herein, wherein the status of the IC is no errors, non-critical errors, or critical errors.

Example 22 is the NTCRM of example 20 and/or some other examples herein, wherein, upon execution, the instructions are further to cause the IC to: process, by a master core, the measured voltage droops from the VDMs; process, by an IO port, the measured voltage droops from the VDMs; determine, the processed voltage droops by the master core are different from the processed voltage droops by the IO port; and determine the respective functionalities of the cores to be functional or nonfunctional based on comparisons between the processed voltage values by the IO port and at least one threshold value.

Example 23 is the NTCRM of example 20 and/or some other examples herein, wherein, upon execution, the instructions are further to cause the IC to: generate signature data for a signature test; and determine individual defectivenesses of the cores, based on respective creativeness of processing the signature data by the cores.

Example 24 is the NTCRM of example 23 and/or some other examples herein, wherein, upon execution, the instructions are further to cause the IC to determine individual operations to the IC, based on the functionalities and the defectiveness of the cores of the IC.

Example 25 is an apparatus of an integrated circuit (IC), comprising: means for generating signature test data based on initiation of a signature test; means for transmitting the signature test data to at least one core of the IC via an interface; means for processing, by a signature collector, the signature test data to a value, based on a polynomial equation; means for determining correctness of the signature test execution with respect to the at least one core, based on comparison between the processed value and one or more predetermined values that are stored in the signature collector; and means for determining whether to isolate the at least one core, based on the correctness of the signature test execution with respect to the at least one core.

Example 26 is the apparatus of example 24 and/or some other examples herein, wherein the interface is a core-to-uncore (C2U) or uncore-to-core (U2C) interface.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The present disclosure is described with reference to flowchart illustrations or block diagrams of methods, apparatuses (systems) and computer program products according to embodiments of the disclosure. It will be understood that each block of the flowchart illustrations or block diagrams, and combinations of blocks in the flowchart illustrations or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means that implement the function/act specified in the flowchart or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide processes for implementing the functions/acts specified in the flowchart or block diagram block or blocks.

The description herein of illustrated implementations, including what is described in the Abstract, is not intended to be exhaustive or to limit the present disclosure to the precise forms disclosed. While specific implementations and examples are described herein for illustrative purposes, a variety of alternate or equivalent embodiments or implementations calculated to achieve the same purposes may be made in light of the above detailed description, without departing from the scope of the present disclosure, as those skilled in the relevant art will recognize.

What is claimed is:

1. An apparatus of an integrated circuit (IC) comprising:
voltage droop monitors (VDMs) to measure voltage values of respective cores in a computing unit of the IC, wherein the VDMs are respectively embedded in each of the cores;

an interconnection to couple VDMs to one another in a ring network; and a master core that is one of the cores, the master core to:
acquire measured voltage values from the VDMs;
determine individual functionalities of the respective cores to be functional or nonfunctional, based on comparison between the measured voltage values and at least one expected voltage value; and
determine, based on the determined functionalities, a status of the IC.

2. The apparatus of claim 1, wherein each measured voltage value of the measured voltage values is associated with an operating frequency at which the corresponding core operates during the measurement, and the at least one expected voltage value is associated with the same operating frequency.

3. The apparatus of claim 1, wherein the status of the IC is no error, non-critical error, or critical error.

4. The apparatus of claim 3, wherein the master core is further to determine, based on the determined status of the IC, an operation to the IC, wherein the operation to the IC is to do nothing according to the status of no error, disable nonfunctional cores of the IC according to the status of non-critical error, or shut down the IC according to the status of critical error.

5. The apparatus of claim 1, further comprising a security engine, wherein the master core is further to report the determined status of the IC to the security engine.

6. The apparatus of claim 5, wherein the security engine is further to determine, based on the reported status of the IC, an operation to the IC, wherein the operation to the IC is to do nothing according to a status of no errors, disable nonfunctional cores of the IC according to a status of non-critical errors, or shut down the IC according to a status of critical errors.

7. The apparatus of claim 5, wherein the security engine is further to report the determined status of the IC to a system controller to determine an operation to the IC.

8. The apparatus of claim 1, wherein the VDMs are further to measure current values respectively corresponding to the measured voltage values of the cores to derive respective power values of the cores, or to measure power values of the cores.

9. The apparatus of claim 1, wherein the VDMs are further to detect voltage droops, based on comparison between the measured voltage values and at least one expected voltage value that are predetermined.

10. The apparatus of claim 1, further comprising VDMs that are embedded in other components on the IC to respectively detect voltage values of the other components, wherein the other components include an input/output (IO) port, a memory fabric, and a memory controller.

11. The apparatus of claim 10, further comprising the IO port, to:
acquire the measured voltage values from the VDMs;
determine functionalities of the cores and the other components to be functional or nonfunctional, based on comparison between the measured voltage values and at least one expected voltage value;
determine, based on the determined functionalities, a status of the IC; and
determine, based on the determined status of the IC, an operation to the IC.

12. The apparatus of claim 11, further comprising a logic controller to:
compare the functionalities determined by the master core and the functionalities determined by the IO port; and
determine the status of the IC based on the functionalities determination by the IO port.

13. One or more non-transitory computer-readable media (NTCRM) comprising instructions to, upon execution of the instructions by circuitry of an integrated circuit (IC), cause the IC to:
initiate a safety test program;
authenticate, by a security engine of a fabric launcher, the safety test program;
measure, by voltage droop monitors (VDMs), voltage droops of cores of the IC, wherein the VDMs are respectively embedded in each of the cores, and wherein the VDMs are coupled to one another in a ring network;
determine, by a master core that is one of the cores of the IC, respective functionalities of the cores to be functional or nonfunctional based on comparisons between the measured voltage droops and at least one threshold value;
determine, by the master core based on the determined functionalities, a status of the IC; and
determine, by the master core based on the determined status of the IC, an operation of the IC.

14. The NTCRM of claim 13, wherein the status of the IC is no errors, non-critical errors, or critical errors.

15. The NTCRM of claim 13, wherein, upon execution, the instructions are further to cause the IC to:
process, by the master core, the measured voltage droops from the VDMs;
process, by an IO port, the measured voltage droops from the VDMs;
determine the processed voltage droops by the master core are different from the processed voltage droops by the IO port; and
determine the respective functionalities of the cores to be functional or nonfunctional based on comparisons between processed voltage values by the IO port and at least one threshold value.

16. The NTCRM of claim 13, wherein, upon execution, the instructions are further to cause the IC to:
generate signature data for a signature test;
acquire the signature test data transmitted to or from the cores of the IC;
compress the acquired data with a predetermined polynomial function to generate respective compressed values corresponding to the acquired data;
determine respective correctnesses of safety test program execution regarding the cores, based on comparison between the respective compressed values and one or more predetermined values; and
determine individual defectivenesses of the cores, based on the respective correctnesses by processing the signature data by the cores.

17. The NTCRM of claim 16, wherein the instructions, upon execution, further cause the IC to determine operations to the IC, based on the determined functionalities and the defectivenesses of the cores of the IC.

* * * * *